United States Patent
Yajima et al.

(10) Patent No.: US 6,855,377 B2
(45) Date of Patent: Feb. 15, 2005

(54) DEPOSITED FILM FORMING APPARATUS AND DEPOSITED FILM FORMING METHOD

(75) Inventors: Takahiro Yajima, Kyoto (JP); Masahiro Kanai, Tokyo (JP); Takeshi Shishido, Kyotanabe (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/656,131

(22) Filed: Sep. 8, 2003

(65) Prior Publication Data

US 2004/0045504 A1 Mar. 11, 2004

Related U.S. Application Data

(62) Division of application No. 09/772,988, filed on Jan. 31, 2001, now Pat. No. 6,638,359.

(30) Foreign Application Priority Data

Jan. 31, 2000 (JP) ........................ 2000-023079
Jan. 31, 2001 (JP) ........................ 2001-023702

(51) Int. Cl.$^7$ ............................. H05H 1/02; H05H 1/00; C23C 16/00
(52) U.S. Cl. .................... 427/434.2; 427/569; 427/580; 118/718; 118/723 E; 156/345.47
(58) Field of Search ............................. 427/434.2, 569, 427/580; 118/718, 723 E, 729, 719, 723 ER, 724–728; 156/345.47, 345.51, 345.52, 345.53; 438/710

(56) References Cited

U.S. PATENT DOCUMENTS

| | | | |
|---|---|---|---|
| 4,800,174 A | 1/1989 | Ishihara et al. ............... 438/96 |
| 5,460,684 A | 10/1995 | Saeki et al. ............ 156/345.51 |
| 5,529,657 A | 6/1996 | Ishii ...................... 156/345.26 |
| 5,589,007 A | 12/1996 | Fujioka et al. .............. 136/249 |
| 5,927,994 A | 7/1999 | Kohda et al. ............... 438/478 |
| 6,007,672 A | 12/1999 | Saito et al. ............ 156/345.47 |
| 6,159,763 A | 12/2000 | Sakai et al. ................... 438/97 |
| 6,526,910 B2 | 3/2003 | Yajima et al. ........... 118/723 E |

FOREIGN PATENT DOCUMENTS

| JP | 63-003338 A | 10/1988 |
|---|---|---|
| JP | 5-56850 B | 8/1993 |
| JP | 9-235676 | 9/1997 |
| JP | 2001-288575 A | 10/2001 |

*Primary Examiner*—Parviz Hassanzadeh
(74) *Attorney, Agent, or Firm*—Fitzpatrick, Cella, Harper & Scinto

(57) ABSTRACT

A deposited film forming apparatus has a power applying electrode disposed above a flat plate type base member grounded, in a vacuum chamber, and a power source for supplying a power to the power applying electrode, the deposited film forming apparatus being constructed to supply the power from the power source to the power applying electrode so as to generate a plasma in a discharge space between the power applying electrode and a substrate disposed in opposition to the power applying electrode in the vacuum chamber and serving as an electrode in a pair with the power applying electrode, thereby decomposing a source gas introduced into the vacuum chamber to form a deposited film on the substrate, wherein the power applying electrode is fixed to the base member with the power applying electrode being isolated from the base member.

2 Claims, 5 Drawing Sheets

DEPOSITED FILM FORMING APPARATUS AND DEPOSITED FILM FORMING METHOD

This application is a division of application Ser. No. 09/772,988, filed Jan. 31, 2001 now U.S. Pat. No. 6,638,359.

BACKGROUND OF THE INVENTION

1. Field of the Invention

The present invention relates to a deposited film forming apparatus constructed to generate a plasma between a power applying electrode connected to a high frequency power source and a substrate disposed in opposition to the power applying electrode and serving as an electrode in a vacuum chamber to decompose a reactive gas introduced into the vacuum chamber to form a thin film as a deposited film on the substrate, and to a deposited film forming method using the deposited film forming apparatus.

2. Related Background Art

In the conventional deposited film forming apparatus, there are a flat plate type base member grounded and a power applying electrode disposed above the base member, housed in a vacuum chamber. The substrate serving as an electrode opposed to the power applying electrode in the vacuum chamber is guided into the vacuum chamber. The power applying electrode is electrically connected to a high frequency power source and the high frequency power source applies a power between the power applying electrode and the substrate. Then, a plasma is generated in a discharge space between the power applying electrode and the substrate to decompose the reactive gas introduced into the vacuum chamber and thus form a thin film as a deposited film on the substrate. In the ordinary plasma processing systems, the power applying electrode is fixed through an insulator to an internal wall of the vacuum chamber, for example, as disclosed in Japanese Patent Application Laid-Open No. 9-235676.

It was feasible heretofore to deposit thin films of amorphous semiconductors and the like on the substrate by use of the deposited film forming apparatus of this type. Since the amorphous semiconductors, e.g. amorphous silicon, can form a thin film in a small thickness and in a large area, provide a high degree of freedom for composition, and present controllability of electrical characteristics and optical characteristics within a wide range, they are recently drawing attention as materials for various semiconductor devices. Particularly, amorphous silicon is becoming a focus of attention as a material for solar cells, because it has such features that the absorption coefficient thereof is larger near the peak of the solar energy spectrum than those of crystalline silicon, that formation temperatures are low, and that a film can be directly formed from a source gas onto a substrate by glow discharge.

As for the solar cells increasingly valued as part of future new energy measures, reduction in cost and improvement in performance are significant subjects of research and development for the time being. Concerning the performance, solar cells with considerably high conversion efficiency have been yielded so far, but the reduction in cost of solar cells is not satisfactory yet. The reason is that the film forming rate of amorphous silicon is small.

A variety of proposals have been made heretofore as methods of forming a film of amorphous silicon at a high speed. An example is a method of decreasing the distance between the power applying electrode and the substrate, as disclosed in Japanese Patent Publication No. 5-56850.

During formation of a thin film of amorphous silicon or the like, the substrate, the power applying electrode, the discharge furnace, etc. are heated to a desired temperature in order to enhance the optical and electrical characteristics of the resultant thin film. Since electrons and ions accelerated by the plasma discharge collide with the substrate and power applying electrode, their temperatures increase. As a consequence, the substrate and power applying electrode undergo thermal expansion, which caused the substrate and power applying electrode to deform, e.g., warp, bend, or curve, as compared with their shapes set at room temperature.

The substrate undergoes no deformation or at most little deformation as long as the substrate is fixed to a substrate holder. The substrate holder is normally provided with a heater or the like and the substrate holder is considerably larger than the substrate. Therefore, the substrate holder is more resistant to deformation than the substrate. In the case of a belt-like substrate or the like guided into the discharge chamber in order to continuously convey the substrate in the roll-to-roll system without use of the substrate holder, the warpage and deformation of the substrate can be suppressed, for example, by securing the substrate by attraction of magnets at the edge portions of the substrate or by increasing the tensile force (tension) on the substrate. However, a thin film will inevitably be deposited on the power applying electrode, so that the power applying electrode tends to deform because of the stress of the thus deposited film. The conventional deposited film forming systems were not constructed in such structure as to hold the power applying electrode about to deform, and thus fine warpage or deformation was experienced.

Influence is little from the deformation of the power applying electrode where the distance between the power applying electrode and the substrate (electrode-substrate distance) is large. However, where the electrode-substrate distance is set small in order to increase the film forming rate, as disclosed in Japanese Patent Publication No. 5-56850, even fine deformation of the power applying electrode can cause a non-negligible range of influence on the electrode-substrate distance. As a result, the unevenness of the electrode-substrate distance resulted in nonuniformity of the plasma and partial difference of film forming rate, thereby posing a problem of unevenness of the film thickness. This problem would be a significant issue where the substrate is conveyed, particularly, where the film is formed while conveying the substrate in the roll-to-roll system.

Further, the deformation of the power applying electrode also makes the distance uneven between the power applying electrode and the base member supporting it, which can cause the plasma to intrude into the space (or gap) between them or which can induce an abnormal discharge in the space. It resulted in waste of the source gas, or generation of polysilane powder because of the undesired discharge state, thus degrading the maintainability of the apparatus and the mass producibility of thin films.

An object of the present invention is to provide a deposited film forming apparatus that can prevent intrusion of a plasma into a space between a base member and a power applying electrode due to deformation of the power applying electrode disposed above the base member in a vacuum chamber, and suppress occurrence of an abnormal discharge in the space.

SUMMARY OF THE INVENTION

In order to accomplish the above object, the present invention provides a deposited film forming apparatus comprising a power applying electrode disposed above a flat plate type base member grounded, in a vacuum chamber, and a power source for supplying a power to the power applying electrode, the apparatus being constructed to apply the power from the power source to the power applying electrode so as to generate a plasma in a discharge space between the power applying electrode and a substrate disposed in opposition to the power applying electrode in the vacuum chamber and serving as an electrode in a pair with the power applying electrode, thereby decomposing a source gas introduced into the vacuum chamber to form a deposited film on the substrate, wherein the power applying electrode is fixed to the base member with the power applying electrode being isolated from the base member.

According to the present invention, the power applying electrode is fixed to the base member while isolating the power applying electrode from the base member in the vacuum chamber, which suppresses the deformation of the power applying electrode due to the thermal expansion, the thermal expansion under plasma irradiation, the deposition of the thin film on the power applying electrode, and so on when the power is applied from the power source to the power applying electrode to generate a plasma in the discharge space between the power applying electrode and the substrate in the vacuum chamber. This improves the uniformity of the plasma and thus decreases the unevenness of the film forming rate of the deposited film to be formed on the substrate. Further, the suppression of the deformation of the power applying electrode permits the distance to be kept uniform between the power applying electrode and the base member, which prevents the intrusion of the plasma into the space between the power applying electrode and the base member and the occurrence of the abnormal discharge in the space. This prevents the waste of the source gas and the generation of polysilane powder, which can improve the maintainability of the deposited film forming apparatus and reduce the cost for formation of the thin film. These permit the thin film to be formed in a large area, which enhances the mass productivity of thin film devices such as solar cells or the like.

The apparatus of the present invention preferably has a mechanism for conveying the substrate, and this mechanism is preferably one for forming the deposited film while conveying the substrate in the roll-to-roll system.

The distance between the power applying electrode and the substrate (electrode-substrate distance) is preferably 5 mm to 20 mm.

The effect of the present invention becomes more eminent by employing either or some of these preferred configurations.

Specific fixing methods suitably applicable include (1) a method of fixing the power applying electrode to the base member with an electrically insulating, fastening member, (2) a method of placing the base member around the power applying electrode and fastening the power applying electrode by the base member, (3) a method of pinching and fastening the base member by the power applying electrode and a power introducing portion penetrating the base member in order to supply the power to the power applying electrode, and (4) a method of fixing the power applying electrode to the base member with an electrically insulating adhesive. The method (2) can be implemented by adopting a method of providing the base member with a depression, fitting the power applying electrode into the depression, and pressing the power applying electrode on every side with fastening members penetrating the base member. In the method (3), the power introducing portion also serves as a fastening member and it is also possible to provide a plurality of power introducing portions. Some of these methods may also be used in combination.

In the apparatus of the present invention, the power applying electrode is preferably fixed to the base member at the end portions of the power applying electrode. The term "end portion" as used in the specification and claims refers to a portion within 2 cm from the periphery of the power applying electrode. From the viewpoint of action, the sufficient condition is that the power applying electrode is fixed to the base member at a location where the deformation of the power applying electrode is suppressed well.

It is preferable to place an electrically insulating spacer between the power applying electrode and the base member.

By placing an electrically insulating spacer between the power applying electrode and the base member to keep the distance between the power applying electrode and the base member at a desired value as described above, it becomes feasible to suppress the intrusion of the plasma into the space between the power applying electrode and the base member and the occurrence of the abnormal discharge in the space well. For example, when the power applying electrode is fixed to the base member with electrically insulating screws or the like, by keeping the distance between the power applying electrode and the base member at a desired value by a spacer, it is possible to prevent shorts between the power applying electrode and the base member due a thin film deposited on exposed surfaces of the screws. The insulating spacer can be in the form of either a block or a sheet, and the spacer is desirably small one in order to reduce influence of emission of impurities or the like from the insulating material constituting the spacer.

Further, it is preferable to fill the space between the power applying electrode and the base member with an electrically insulating material.

The filling of an insulating material between the power applying electrode and the base member as described above perfectly prevents the intrusion of the plasma into the space between the power applying electrode and the base member and the generation of the abnormal discharge in the space. Japanese Patent Publication No. 63-3338 discloses coating an electrode with an insulating material to prevent dispersion of a plasma, but it is actually impossible to perfectly prevent the intrusion of the plasma, the abnormal discharge, and so on in the case where the electrode is merely covered with the insulating material and there still exists a space.

Further, it is preferred that the distance s [mm] between the power applying electrode and the base member satisfies the relation of $s \leq k/P$, where s [mm] is the distance between the power applying electrode and the base member, P [Pa] is the pressure in the vacuum chamber during formation of the deposited film, and k is a constant of 1500 [Pa·mm].

As described above, by setting the distance s between the power applying electrode and the base member in the range of $s \leq k/P$, it becomes feasible to suppress the intrusion of the plasma into the space between the power applying electrode and the base member and the occurrence of the abnormal discharge in the space and to prevent shorts between the power applying electrode and the base member due to deposition of thin films on screws or the like for securing the power applying electrode to the base member. Further, it can prevent loss of the source gas and generation of polysilane powder.

The present invention also provides a deposited film forming method using the above deposited film forming apparatus.

DETAILED DESCRIPTION OF THE PREFERRED EMBODIMENTS

The preferred embodiments of the present invention will be described hereinafter with reference to the drawings. It is noted that the present invention is by no means intended to be limited to the embodiments described hereinafter.

First Embodiment

Figure 1:
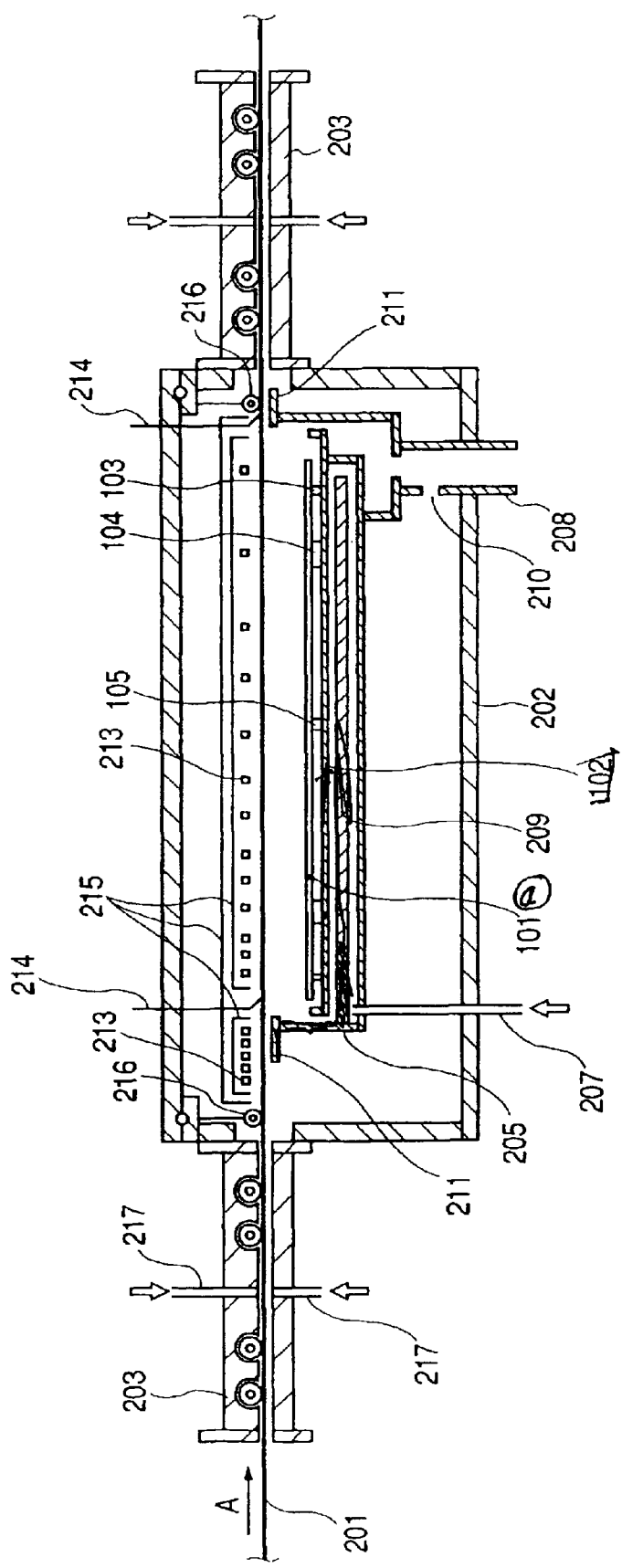
FIG. 1 is a schematic cross-sectional view showing a deposited film forming apparatus of a first embodiment of the present invention.

FIG. 1 is a schematic cross-sectional view showing the deposited film forming apparatus of a first embodiment of the present invention. The following will describe an example of the parallel plate capacitive coupled type illustrated in FIG. 1, as the deposited film forming apparatus of the present embodiment and a case in which a thin film of amorphous silicon is deposited on a belt-like substrate of stainless steel by use of the deposited film forming apparatus.

In the deposited film forming apparatus of the present embodiment, as illustrated in FIG. 1, a discharge chamber 205 as a vacuum chamber is provided inside a vacuum vessel 202 of a rectangular parallelepiped shape. The vacuum vessel 202 is coupled through a gas gate 203 to other vacuum vessels (not shown) adjacent thereto through the gas gate 203 on either side. The belt-like substrate 201 of stainless steel penetrates the interior of the gas gates 203 and the belt-like substrate 201 is guided into the vacuum vessel 202. Further, the belt-like substrate 201 is guided into the discharge chamber 205. Gas of $H_2$, He, or the like is guided through gate gas inlet tubes 217 into the gas gates 203, thereby separating the atmospheric gases and pressures in the adjacent vacuum vessels. The belt-like substrate 201 is conveyed in the direction of arrow A illustrated in FIG. 1, by rollers or the like disposed in the gas gates 203.

Support rollers 216 journaled for supporting the belt-like substrate 201 are disposed near the respective gas gate 203 inside the vacuum vessel 202. Inside the vacuum vessel 202, a plurality of lamp heaters 213 for heating the belt-like substrate 201 are arranged along the conveyance path of the belt-like substrate 201. Reflectors 215 for reflecting heat from the lamp heaters 213 toward the belt-like substrate 201 are arranged on the opposite side of the lamp heaters 213 to the belt-like substrate 201.

The discharge chamber 205 provided inside the vacuum vessel 202 is constructed in a hollow rectangular parallelepiped shape with apertures in one surface of the discharge chamber 205 and in another surface opposed to the mentioned surface, and the belt-like substrate 201 is guided through the aperture into the discharge chamber 205. Aperture adjuster plates 211 for adjusting the size of the apertures are provided on the opposite side to the lamp heater 213 side in the respective apertures of the discharge chamber 205. The belt-like substrate 201 is guided through one aperture of the discharge chamber 205 into the discharge chamber 205.

After guided into the discharge chamber 205, the belt-like substrate 201 is heated by the lamp heaters 213 in the vacuum vessel 202 and the temperature of the belt-like substrate 201 is regulated using thermocouples 214 set in the vacuum vessel 202. A parallel plate type power applying electrode 101 is housed in parallel to the belt-like substrate 201 in the discharge chamber 205 and a power is supplied from a high frequency power source (not shown) to the power applying electrode 101. This enables a plasma to be induced in the discharge chamber 205.

The source gas to be fed into the discharge chamber 205 is supplied from a gas supply source (not shown) through a source gas inlet tube 207 penetrating the wall of the vacuum vessel 202, into the discharge chamber 205. The source gas introduced into the discharge chamber 205 is heated by a block heater 209 in the discharge chamber 205. The interior of the discharge chamber 205 is in communication with an exhaust duct 208 for exhaust of the source gas. The flow of the source gas inside the discharge chamber 205 is such that the source gas flowing through the source gas inlet tube 207 into the discharge chamber 205 flows in the direction parallel to the conveying direction of the belt-like substrate 201 and flows above the power applying electrode 101 in the discharge chamber 205. After that, the source gas in the discharge chamber 205 flows through the exhaust duct 208 to the outside of the discharge chamber 205 and is then discharged to the exterior of the vacuum vessel 202. Part of the gate gas and the source gas in the vacuum vessel 202 is discharged through a discharge chamber-exterior exhaust port 210 bored in part of the exhaust duct 208, to the exterior of the vacuum vessel 202.

Inside the discharge chamber 205, the power applying electrode 101 is located above a surface of the flat plate type base member 102 on the belt-like substrate 201 side, and the base member 102 and the power applying electrode 101 are parallel to each other. The base member 102 is grounded and the power applying electrode 101 is electrically connected to a high frequency power source (not shown). The belt-like substrate 201 is guided into the vacuum vessel 202 so that the belt-like substrate 201 is opposed to the power applying electrode 101 in the vacuum vessel 202. A portion of the belt-like substrate 201 inside the vacuum vessel 202, i.e., a portion opposed to the power applying electrode 101 serves as an electrode, and a plasma is induced between the power applying electrode 101 and the belt-like substrate 201. The plasma decomposes the reactive gas (i.e., source gas) introduced into the discharge chamber 205 to form a thin film as a deposited film on the surface of the belt-like substrate 201.

The power applying electrode 101 is fixed to the base member 102 while maintaining electric insulation thereof from the base member 102, as described hereinafter on the basis of FIG. 2. The base member 102 has an area and a volume both larger than those of the power applying electrode 101 and the deformation such as warpage, curvature, or the like of the power applying electrode 101 is mechanically suppressed by fixing the power applying electrode 101 to the base member 102. This permits uniform plasma to be generated even in cases where the distance is small between the power applying electrode 101 and the belt-like substrate 201, decreases the unevenness of the film forming rate of the thin film formed on the belt-like substrate 201, and thus permits the film to be formed with uniform film quality, for example, in terms of the crystallinity, hydrogen bonding state, and optical and electrical characteristics.

Here, the material of the base member 102 is usually metal which is inexpensive and easy to machine. The material of the base member 102 may also be an electrically insulating material and in that case electrically conductive members can be used as fastening members for fixing and others.

Figure 2:
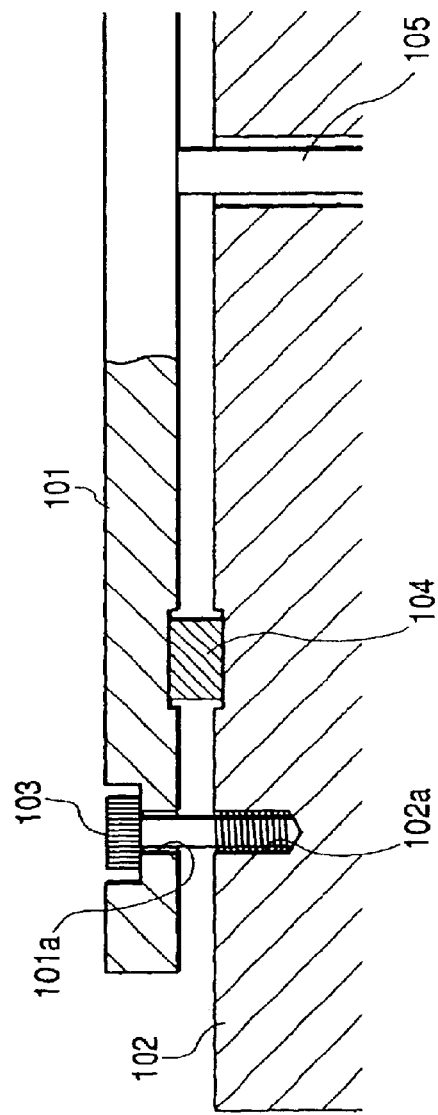
FIG. 2 is a cross-sectional view schematically showing a configuration for securing the power applying electrode to the base member in the discharge chamber illustrated in FIG. 1.

FIG. 2 is a cross-sectional view schematically showing a configuration for securing the power applying electrode 101 to the base member 102 in the discharge chamber illustrated in FIG. 1. In the present embodiment, as illustrated in FIG. 2, end portions of the power applying electrode 101 are pressed against the base member 102 by electrically insulating, fastening members 103, and electrically insulating spacers 104 of a block shape are interposed between the power applying electrode 101 and the base member 102 so as to keep the distance at a desired value between the power applying electrode 101 and the base member 102. In this configuration, the power applying electrode 101 is fixed to the base member 102 by the fastening members 103 and spacers 104 while maintaining the electric insulation of the power applying electrode 101 from the base member 102.

The insulating spacers 104 may be either of a block shape or of a sheet shape and the spacers 104 are desirably small ones in order to reduce the influence of emission of impurities or the like from the insulating material constituting the spacers 104. The fastening members 103 are, specifically, insulating screws. Holes 101a for the fastening members 103 to be put therein are bored in the power applying electrode 101 and screw holes 102a for the fastening members 103 to be screwed thereinto are bored in the base member 102. The fastening members 103 are put into the holes 101a of the power applying electrode 101 and screwed into the screw holes 102a of the base member 102, whereby the power applying electrode 101 is pressed to the base member 102 by the fastening members 103.

As illustrated in FIGS. 1 and 2, one end of a power introducing portion 105 passing through the interior of the base member 102 is connected to the surface of the power applying electrode 101 in the central area and on the base member 102 side. The high frequency power source is connected through the power introducing portion 105 to the power applying electrode 101 and the high frequency power source applies the power through the power introducing portion 105 to the power applying electrode 101.

As described above, the power applying electrode 101 can be fixed to the base member 102 without a short by use of the insulating, fastening members 103, but a thin film would be deposited on the exposed portions of the fastening members 103 if the plasma generated between the power applying electrode 101 and the belt-like substrate 201 opposed thereto should intrude into the space between the power applying electrode 101 and the base member 102 or if abnormal discharge should occur between the power applying electrode 101 and the base member 102. If the deposited film is a thin film with a high conductivity at the film forming temperature of the deposited film, the power applying electrode 101 and the base member 102 would be short-circuited through the thin film deposited on the exposed portions of the fastening members 103. Therefore, the insulating spacers 104 are used to keep the distance at the desired value between the power applying electrode 101 and the base member 102 as described above, so as to suppress the intrusion of the plasma and the abnormal discharge between the power applying electrode 101 and the base member 102, thereby preventing shorts between the power applying electrode 101 and the base member 102 due to the deposition of the thin film on the exposed portions of the fastening members 103.

Using the deposited film forming apparatus of the present embodiment wherein the power applying electrode 101 was secured to the base member 102 with the insulating, fastening members 103 and the insulating spacers 104, a mixed gas of $SiH_4$ gas and $H_2$ gas were allowed to flow into the discharge chamber 205. A high frequency power of the frequency of 13.56 MHz was applied to the power applying electrode 101 to induce a plasma in the discharge space between the power applying electrode 101 and the belt-like substrate 201, so that a thin film of amorphous silicon was formed for 5 minutes as a deposited film on the belt-like substrate 201 kept still. The distance was kept at 20 mm between the power applying electrode 101 and the belt-like substrate 201 in order to deposit the amorphous silicon film at a high film forming rate.

Figure 3:
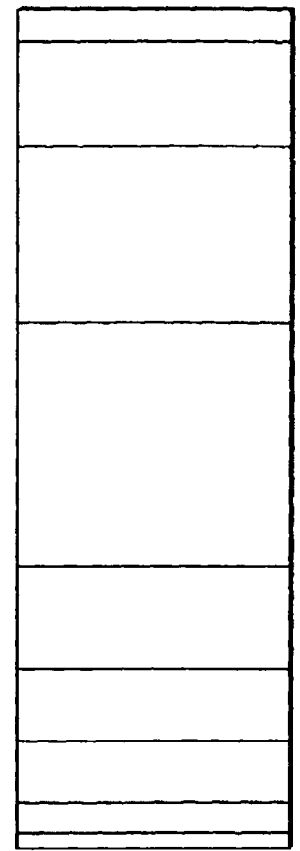
FIG. 3 is a schematic view showing equithickness lines of the thickness of a thin film deposited on the substrate by use of the deposited film forming apparatus described on the basis of FIG. 1 and FIG. 2.

FIG. 3 is a plan view showing equithickness lines of the thickness of the amorphous silicon film, which is a schematic diagram to indicate a thickness distribution of the amorphous silicon film deposited on the belt-like substrate 201 by the above-stated deposited film forming apparatus. FIG. 3 is the plan view of the side of the belt-like substrate 201 where the thin film was deposited, as a view from above the film-side surface. FIG. 3 shows lines of equithickness portions of the amorphous silicon film (equithickness lines). The direction of the flow of the source gas is the direction of arrow A illustrated in FIG. 3, i.e., the direction parallel to the longer sides in FIG. 3, and the width direction of the belt-like substrate 201 agrees with the direction perpendicular to the direction of the flow, i.e., the direction parallel to the shorter sides in FIG. 3. As illustrated in FIG. 3, the amorphous silicon film formed on the belt-like substrate 201 by the deposited film forming apparatus of the present embodiment demonstrated little difference of thickness in the direction perpendicular to the direction of the flow of the source gas and thus was obtained with the almost linear equithickness lines.

In the present embodiment, the fastening members 103 are placed at the end portions of the power applying electrode 101, which are distant from the central area of the power applying electrode 101, i.e., from the location where the power introducing portion 105 is connected in FIG. 2. Thus, the fastening members 103 are provided at the locations effective to prevent the warpage of the power applying electrode 101 when heat is applied to the power applying electrode 101.

Figure 4:
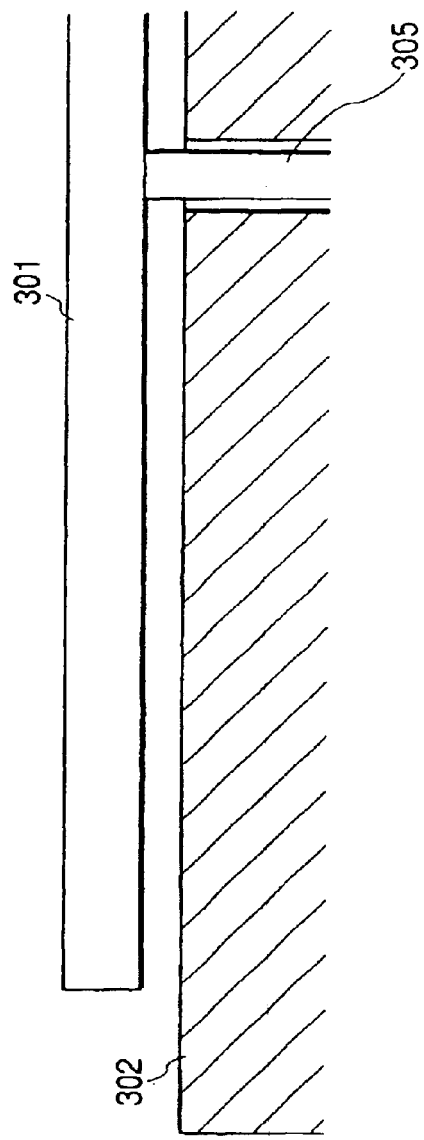
FIG. 4 is a cross-sectional view schematically showing a configuration of a comparative example against the deposited film forming apparatus described on the basis of FIG. 1 and FIG. 2.
Figure 5:
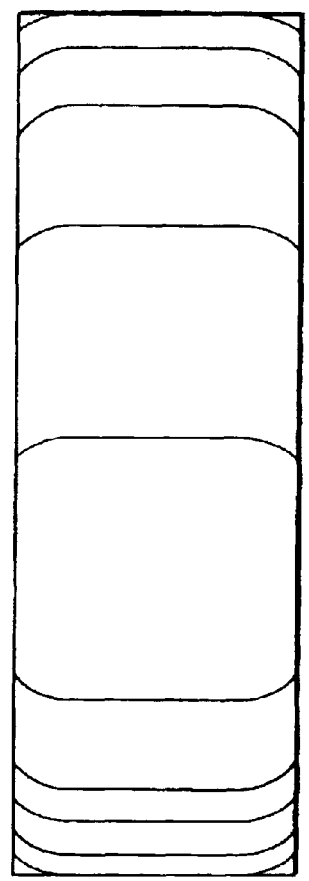
FIG. 5 is a schematic view showing equithickness lines of the thickness of a thin film obtained on the substrate by use of the deposited film forming apparatus of the structure illustrated in FIG. 4.

As a comparative example, FIG. 5 shows a deposition rate distribution for a configuration where the fastening members 103 and spacers 104 are not used and the power applying electrode 301 is not secured to the base member 302, as illustrated in FIG. 4. In the comparative example illustrated in FIG. 4, the shapes and sizes of the base member 302, power applying electrode 301, and power introducing portion 305 are substantially the same as those of the base member 102, power applying electrode 101, and power introducing portion 105 illustrated in FIG. 1 and FIG. 2.

When the power applying electrode 301 was not secured to the base member 302 by the fastening members or the like, as illustrated in FIG. 4, the power applying electrode 301 underwent the deformation of warpage, curvature, or the like because of the causes of thermal expansion, plasma irradiation, deposition of a thin film on the power applying electrode 301, and so on, there appeared the difference between deposition rate distributions in the central area and in the edge portions of the belt-like substrate 201 as illustrated in FIG. 5, and thus the amorphous silicon film had the difference in thickness in the direction of the width of the belt-like substrate 201.

As described above, since the deposited film forming apparatus of the present embodiment is constructed in such a structure that the power applying electrode 101 is fixed to the base member 102 with the power applying electrode 101 being isolated from the base member 102 in the discharge chamber 205, it well suppresses the deformation of the power applying electrode 101 due to the thermal expansion, the thermal expansion under plasma irradiation, the deposition of a thin film on the power applying electrode 101, and so on. Therefore, it improves the uniformity of the plasma and decreases the unevenness of the deposition rate of the deposited film formed on the belt-like substrate 201. Further, since the distance is kept even between the power applying electrode 101 and the base member 102 by the suppression of the deformation of the power applying electrode 101, the plasma is prevented from intruding into the space between the power applying electrode 101 and the base member 102 and abnormal discharge is prevented from occurring in the space. Accordingly, it becomes possible to prevent the waste of the source gas and the generation of polysilane powder, which improves the maintainability of the deposited film forming apparatus and reduces the cost for formation of thin films. These permit a thin film to be formed in a large area and enhance the mass producibility of thin film devices such as solar cells or the like.

In the specification and claims, the term "power applying electrode" refers to an electrode to which the power is applied, or an electrode opposed to the substrate, and a DC plasma, a low frequency plasma, a high frequency plasma, or a VHF plasma can be induced by supplying to the power applying electrode, i.e., to the power applying electrode 101 illustrated in FIG. 1, a DC power, a low-frequency power of 5 kHz to 500 kHz, a high frequency power of 500 kHz to 30 MHz, or a VHF power of 30 MHz to 500 MHz, respectively. Then, a gas or the like is decomposed by either one of the plasmas to deposit a thin film of a semiconductor or the like on the belt-like substrate 201.

In the deposited film forming apparatus of the present embodiment, the belt-like substrate 201 may be replaced by a simple substrate that is not a belt-like substrate. The belt-like substrate 201 can be a light transmissive insulator such as a glass substrate or the like mounted on a substrate support, or a non-light-transmissive conductor such as a stainless steel substrate or the like. Further, the belt-like substrate 201 may be a long belt-like substrate wound in a coil form, a flexible conductive substrate such as a conductive polymer film or the like, and so on.

Second Embodiment

Figure 6:
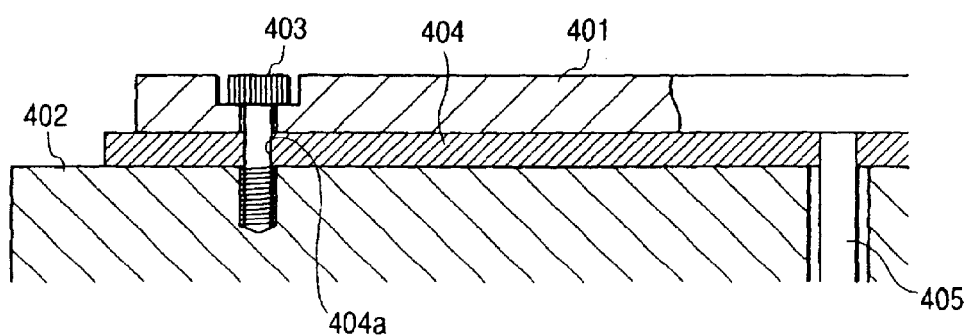
FIG. 6 is a cross-sectional view schematically showing a configuration for securing the power applying electrode to the base member in the deposited film forming apparatus of a second embodiment of the present invention.

FIG. 6 is a cross-sectional view schematically showing a configuration for securing the power applying electrode to the base member in the deposited film forming apparatus of a second embodiment of the present invention. The deposited film forming apparatus of the present embodiment is different in the configuration for securing the power applying electrode to the base member in the discharge chamber from the apparatus of the first embodiment, and the following will mainly describe the difference from the first embodiment.

As illustrated in FIG. 6, the deposited film forming apparatus of the present embodiment employs an electrically insulating sheet 404 instead of the insulating spacers 104 used in the first embodiment. The contour of the insulating sheet 404 is somewhat larger than the power applying electrode 401. Just as in the first embodiment, the power applying electrode 401 is pressed to the base member 402 by the insulating, fastening members 403, and the insulating sheet 404 is interposed between the power applying electrode 401 and the base member 402 so that the entire surface of the power applying electrode 401 on the base member 402 side is in contact with the insulating sheet 404. Accordingly, the insulating sheet 404 as an insulating material fills the entirety of the space between the power applying electrode 401 and base member 402. The thickness of the insulating sheet 404 is determined so that the distance between the power applying electrode 401 and the base member 402 becomes a desired value as in the first embodiment. Holes 404a for the fastening members 403 to be put therein are formed in portions of the insulating sheet 404 corresponding to the fastening members 403.

As described above, the power applying electrode 401 is fixed to the base member 402 while maintaining the electric insulation of the power applying electrode 401 from the base member 402, by the fastening members 403 and the insulating sheet 404. Using the deposited film forming apparatus having this configuration, a thin film of amorphous silicon was deposited on the surface of the belt-like substrate 201 in the same manner as in the first embodiment. The distance between the power applying electrode 401 and the belt-like substrate 201 was 20 mm.

To a surface of the power applying electrode 401 in the central area and on the base member 402 side is connected one end of the power introducing portion 405 passing through the interior of the base member 402. A high frequency power source (not shown) is connected through the power introducing portion 405 to the power applying electrode 401, and the high frequency power source applies a power through the power introducing portion 405 to the power applying electrode 401.

In the present embodiment, a thin film of amorphous silicon was also obtained in a uniform thickness in the direction of the width of the belt-like substrate 201 as in the first embodiment. The use of the insulating sheet 404 also permits the suppression of the deformation such as the warpage, curvature, or the like of the edge portions of the power applying electrode 401. Further, since the insulating sheet 404 fills the entire space between the power applying electrode 401 and the base member 402, there occurs neither abnormal discharge nor polysilane powder generation between the power applying electrode 401 and the base member 402, so that a stable plasma with a self-bias variation of ±3% or less was attained during the film formation period of one hour.

Third Embodiment

Figure 7:
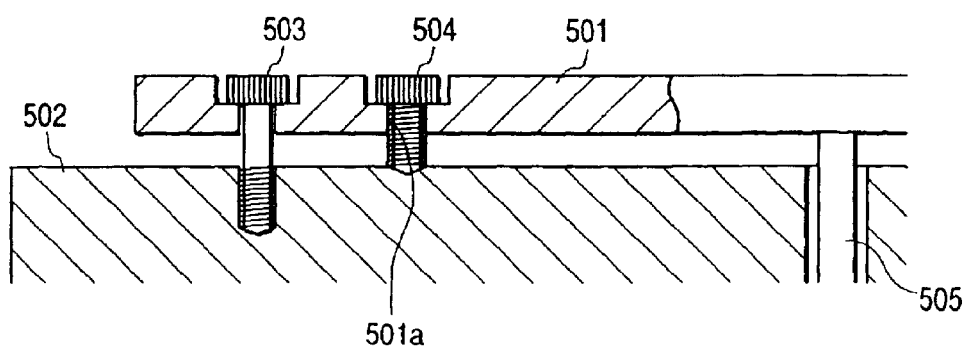
FIG. 7 is a cross-sectional view schematically showing a configuration for securing the power applying electrode to the base member in the deposited film forming apparatus of a third embodiment of the present invention.

FIG. 7 is a cross-sectional view schematically showing a configuration for fixing the power applying electrode to the base member in the deposited film forming apparatus of a third embodiment of the present invention. The deposited film forming apparatus of the present embodiment is also different in the configuration for fixing the power applying electrode to the base member in the discharge chamber from the apparatus of the first embodiment, and the following will mainly describe the difference from the first embodiment.

As illustrated in FIG. 7, the deposited film forming apparatus of the present embodiment employs electrically insulating, gap adjusting screws 504 instead of the insulating spacers 104 used in the first embodiment. Screw holes 501a for the gap adjusting screws 504 to mesh with are bored in the power applying electrode 501. The screw holes 501a penetrate the power applying electrode 501 and the gap adjusting screws 504 mesh with the screw holes 501a from the opposite side of the power applying electrode 501 to the base member 502 side. The distal end of each gap adjusting screw 504 in mesh with the corresponding screw hole 501a on the base member 502 side projects from the surface of the power applying electrode 501 on the base member 502 side and the distal end of the gap adjusting screw 504 abuts against the surface of the base member 502 on the power applying electrode 501 side, thereby restraining movement of the power applying electrode 501 toward the base member 502.

The power applying electrode 501 is pressed to the base member 502 by the insulating, fastening members 503, as in the first embodiment. Then, the screwing depth of the fastening members 503 into the base member 502 and the screwing depth of the gap adjusting screws 504 into the screw holes 501a of the power applying electrode 501 are determined so that the distance becomes a desired value between the power applying electrode 501 and the base member 502, as in the first embodiment.

By using the gap adjusting screws 504 in this way, the distance can be readily set to the desired value between the power applying electrode 501 and the base member 502.

In this way, the power applying electrode 501 is fixed to the base member 502 while maintaining the electric insulation of the power applying electrode 501 from the base member 502, by the fastening members 503 and the gap adjusting screws 504. Using the deposited film forming apparatus having the above configuration, a thin film of amorphous silicon was deposited on the surface of the belt-like substrate 201 in the same manner as in the first embodiment. The distance herein was 20 mm between the power applying electrode 501 and the belt-like substrate 201.

To a surface of the power applying electrode 501 in the central area and on the base member 502 side is connected one end of the power introducing portion 505 passing through the interior of the base member 502. A high frequency power source (not shown) is connected through the power introducing portion 505 to the power applying electrode 501 and the high frequency power source applies a power through the power introducing portion 505 to the power applying electrode 501.

In the present embodiment, an amorphous silicon thin film was also obtained in a uniform thickness in the direction of the width of the belt-like substrate 201, as in the first embodiment. In the present embodiment, attention is paid to the distance between the power applying electrode 501 and the base member 502, and the distance s [mm] between the power applying electrode 501 and the base member 502 can be adjusted by the fastening members 503 and the gap adjusting screws 504, depending on the variation in the film forming pressure P in the discharge chamber 205 as a forming condition (parameter) of the thin film. By setting the distance between the power applying electrode 501 and the base member 502 to a desired value by the fastening members 503 and gap adjusting screws 504, it is possible to prevent a plasma from intruding into the space between the power applying electrode 501 and the base member 502 and to prevent an abnormal discharge from occurring in the space. In addition, it is feasible to prevent shorts between the power applying electrode 501 and the base member 502 due to deposition of a thin film on the fastening members 503 and gap adjusting screws 504.

Figure 8:
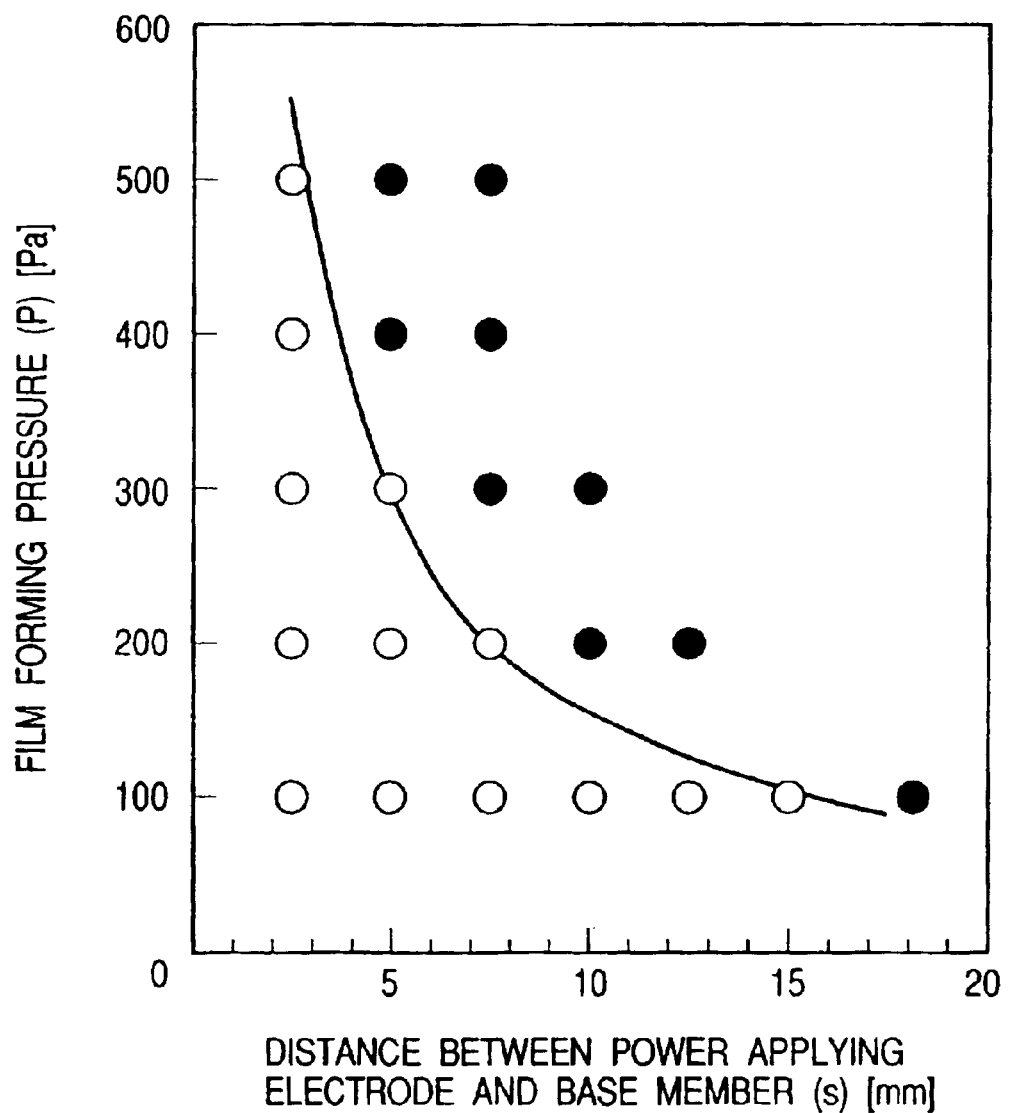
FIG. 8 is a graphical representation showing the state of generation of polysilane powder between the power applying electrode and the base member with variations in the film forming pressure P and in the distance s between the power applying electrode and the base member in the deposited film forming apparatus described on the basis of FIG. 7.

FIG. 8 is a graphical representation showing the state of generation of polysilane powder due to the abnormal discharge between the power applying electrode 501 and the base member 502 with a change in the film forming pressure P while adjusting the distance s between the power applying electrode 501 and the base member 502 against variation in the film forming pressure in the deposited film forming apparatus of the present embodiment. In FIG. 8, the mark ○ indicates absence of polysilane powder and the mark ● presence of polysilane powder. As illustrated in FIG. 8, the polysilane powder is generated within the range of the distance s>1500/P against the film forming pressure P [Pa]. Namely, the value of the distance s [mm] between the power applying electrode 501 and the base member 502 needs to be set to satisfy the relation of s≦k/P, where P [Pa] is the pressure inside the discharge chamber 205 during formation of the deposited film, i.e., the pressure in the vacuum chamber and k is a constant of 1500 [Pa·mm]. When the value of the distance s [mm] is set within the above range, it becomes feasible to well suppress the generation of polysilane powder due to the abnormal discharge between the power applying electrode 501 and the base member 502.

According to the present invention, as described above, by fixing the power applying electrode to the base member while maintaining the electric insulation of the power applying electrode from the base member in the vacuum chamber in the deposited film forming apparatus, the deformation of the power applying electrode due to the thermal expansion, plasma irradiation, deposition of a thin film on the power applying electrode, and so on is suppressed to improve the uniformity of the plasma, so that reduction of the cost for formation of a thin film and increase of the area of the thin film becomes possible, thereby enhancing the mass producibility of thin film devices such as solar cells or the like.

What is claimed is:

1. A method of forming a deposited film comprising:
   (a) introducing a source gas comprising a film-forming reactive gas into a vacuum chamber; and
   (b) supplying power from a power source to a power applying electrode spaced above a grounded flat plate base member, said power applying electrode and said base member disposed in the vacuum chamber, to generate a plasma in a discharge space between the power applying electrode and a substrate disposed in opposition to the power supplying electrode in the vacuum chamber to decompose the source gas and form a deposited film on the substrate, said power applying electrode fixed to the base member by a plurality of electrically insulating fastening members at positions effective to suppress deformation of the power applying electrode and an electrically insulating spacer being placed between the power supplying electrode and the base member to electrically insulate the power applying electrode from the base member.

2. A method of forming a deposited film comprising:

(a) introducing a source gas comprising a film-forming reactive gas into a vacuum chamber; and (b) supplying power from a power source to a power applying electrode spaced above a grounded flat plate base insulating member, said power applying electrode and said base member disposed in the vacuum chamber, to generate a plasma in a discharge space between the power applying electrode and a substrate disposed in opposition to the power supplying electrode in the vacuum chamber to decompose the source gas and form a deposited film on the substrate, said power applying electrode fixed to the base member by a plurality of fastening members at positions effective to suppress deformation of the power applying electrode and an electrically insulating spacer being placed between the power supplying electrode and the base member to electrically insulate the power applying electrode from the base member.

* * * * *